US009716504B2

(12) United States Patent
Fujita

(10) Patent No.: US 9,716,504 B2
(45) Date of Patent: Jul. 25, 2017

(54) POWER SUPPLY SYSTEM AND METHOD FOR CONTROLLING POWER SUPPLY SYSTEM

(71) Applicant: NISSAN MOTOR CO., LTD., Yokohama-shi, Kanagawa (JP)

(72) Inventor: Takeshi Fujita, Hayama-machi (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 343 days.

(21) Appl. No.: 14/421,234

(22) PCT Filed: Jul. 5, 2013

(86) PCT No.: PCT/JP2013/068476

§ 371 (c)(1),
(2) Date: Feb. 12, 2015

(87) PCT Pub. No.: WO2014/027527

PCT Pub. Date: Feb. 20, 2014

(65) Prior Publication Data

US 2015/0207512 A1 Jul. 23, 2015

(30) Foreign Application Priority Data

Aug. 16, 2012 (JP) ................................ 2012-180323

(51) Int. Cl.

| | |
|---|---|
| ***H01J 1/12*** | (2006.01) |
| ***H03L 5/02*** | (2006.01) |
| ***H01M 8/04828*** | (2016.01) |
| ***H01M 16/00*** | (2006.01) |
| ***H01M 8/04537*** | (2016.01) |
| ***H02J 7/34*** | (2006.01) |
| ***H01M 10/44*** | (2006.01) |

(Continued)

(52) U.S. Cl.
CPC ................ *H03L 5/02* (2013.01); *G05B 15/02* (2013.01); *H01M 8/0494* (2013.01);
(Continued)

(58) Field of Classification Search
None
See application file for complete search history.

(56) References Cited

U.S. PATENT DOCUMENTS

| | | | |
|---|---|---|---|
| 7,005,204 | B2 | 2/2006 | Aoyagi et al. |
| 7,049,788 | B2 | 5/2006 | Itou |

(Continued)

FOREIGN PATENT DOCUMENTS

| | | | |
|---|---|---|---|
| JP | 2001-325976 | A | 11/2001 |
| JP | 2003-235162 | A | 8/2003 |

(Continued)

*Primary Examiner* — Long Nguyen
(74) *Attorney, Agent, or Firm* — Foley & Lardner LLP

(57) ABSTRACT

A power control device 9 of the present invention includes: a power-supply target value obtaining unit 21 configured to obtain electric power being currently consumed by a load as a power-supply target value; a generated-power detection unit 22 configured to detect a generated-power value generated by a fuel cell 2 with respect to the power-supply target value; a power compensation amount calculation unit 23 configured to calculate a deviation of the generated-power value from the power-supply target value and determine an amount of power compensation to be supplied to the load from a storage cell 6; and an output power control unit 24 configured to determine current transient response characteristics of the storage cell 6, and perform control so that output power from the storage cell 6 becomes equal to the amount of power compensation based on the current transient response characteristics.

7 Claims, 5 Drawing Sheets

(51) Int. Cl.

| | |
|---|---|
| ***H01M 10/48*** | (2006.01) |
| ***G05B 15/02*** | (2006.01) |
| ***H02J 1/10*** | (2006.01) |
| *H01M 10/42* | (2006.01) |
| *H02J 1/00* | (2006.01) |

(52) U.S. Cl.

CPC ... *H01M 8/04604* (2013.01); *H01M 8/04619* (2013.01); *H01M 8/04656* (2013.01); *H01M 10/44* (2013.01); *H01M 10/48* (2013.01); *H01M 16/006* (2013.01); *H02J 1/102* (2013.01); *H02J 7/34* (2013.01); *H01M 2010/4271* (2013.01); *H02J 2001/004* (2013.01)

(56) References Cited

U.S. PATENT DOCUMENTS

| | | | | |
|---|---|---|---|---|
| 7,301,302 | B2 | 11/2007 | Yoshii | |
| 7,485,383 | B2 | 2/2009 | Aoyagi et al. | |
| 7,583,052 | B2 | 9/2009 | Yoshii | |
| 2002/0172847 | A1 | 11/2002 | Aoyagi et al. | |
| 2003/0106726 | A1 | 6/2003 | Yoshii | |
| 2004/0136211 | A1 | 7/2004 | Itou | |
| 2006/0105206 | A1 | 5/2006 | Aoyagi et al. | |
| 2007/0231630 | A1* | 10/2007 | Yoshii | H01M 8/04626 429/430 |
| 2010/0127667 | A1* | 5/2010 | Lin | H02J 7/0009 320/153 |
| 2012/0228941 | A1* | 9/2012 | Sakai | H02J 3/383 307/66 |

FOREIGN PATENT DOCUMENTS

| | | | |
|---|---|---|---|
| JP | 2003-324853 | A | 11/2003 |
| JP | 2004-222376 | A | 8/2004 |
| JP | 2005-037233 | A | 2/2005 |
| JP | 2007-068290 | A | 3/2007 |
| JP | 4294884 | B2 | 7/2009 |
| JP | 2010-183785 | A | 8/2010 |
| JP | 2011-223870 | A | 11/2011 |
| JP | 2012-090404 | A | 5/2012 |

* cited by examiner

POWER SUPPLY SYSTEM AND METHOD FOR CONTROLLING POWER SUPPLY SYSTEM

TECHNICAL FIELD

The present invention relates to a power supply system in which a power generating device and a storage cell are connected in parallel to supply electric power to a load, and a method for controlling the same.

BACKGROUND ART

Recently, a hybrid power supply system in which a storage cell is connected in parallel with a fuel cell as a power generating device such that both the fuel cell and the storage cell supply electric power to a load has been developed. It is considered that such a power supply system compensates for the lack of electric power generated by the fuel cell for power consumption in the load due to response characteristics (or response delay) of the electric power by output power from the storage cell (Patent Literature 1).

CITATION LIST

Patent Literature

Patent Literature 1: Japanese Patent Application Publication No. 2003-235162

SUMMARY OF INVENTION

However, the above-mentioned conventional power supply system does not take into account transient response characteristics of the output power from the storage cell, and thus has the problem of being incapable of accurately compensating for the output power. For example, when the electric power generated by the fuel cell is insufficient for the power consumption by the load, even if an attempt is made to compensate for the generated power by the output power from the storage cell, sufficient output power cannot be obtained depending on the transient response characteristics of the output power from the storage cell, which in turn leads to the problem of causing an excessive or insufficient amount of electric power supplied to the load.

Therefore, the present invention has been proposed in view of the above-mentioned circumstances. An object of the present invention is to provide a power supply system and a method for controlling a power supply system, capable of accurately compensating for output power to a load.

In order to solve the foregoing problem, the present invention provides a power supply system including a storage cell connected in parallel with a power generating device. The power supply system obtains electric power being currently consumed by a load, as a power-supply target value, and detects a generated-power value of electric power generated by the power generating device with respect to the power-supply target value. Then, the power supply system calculates a deviation of the generated-power value from the power-supply target value and determines an amount of power compensation to be supplied to the load from the storage cell, and determines current transient response characteristics of the storage cell, and performs control so that output power from the storage cell becomes equal to the amount of power compensation based on the current transient response characteristics.

DESCRIPTION OF EMBODIMENTS

Description will be given below with reference to the drawings with regard to one embodiment to which the present invention is applied.

[Configuration of Power Supply System]

Figure 1:
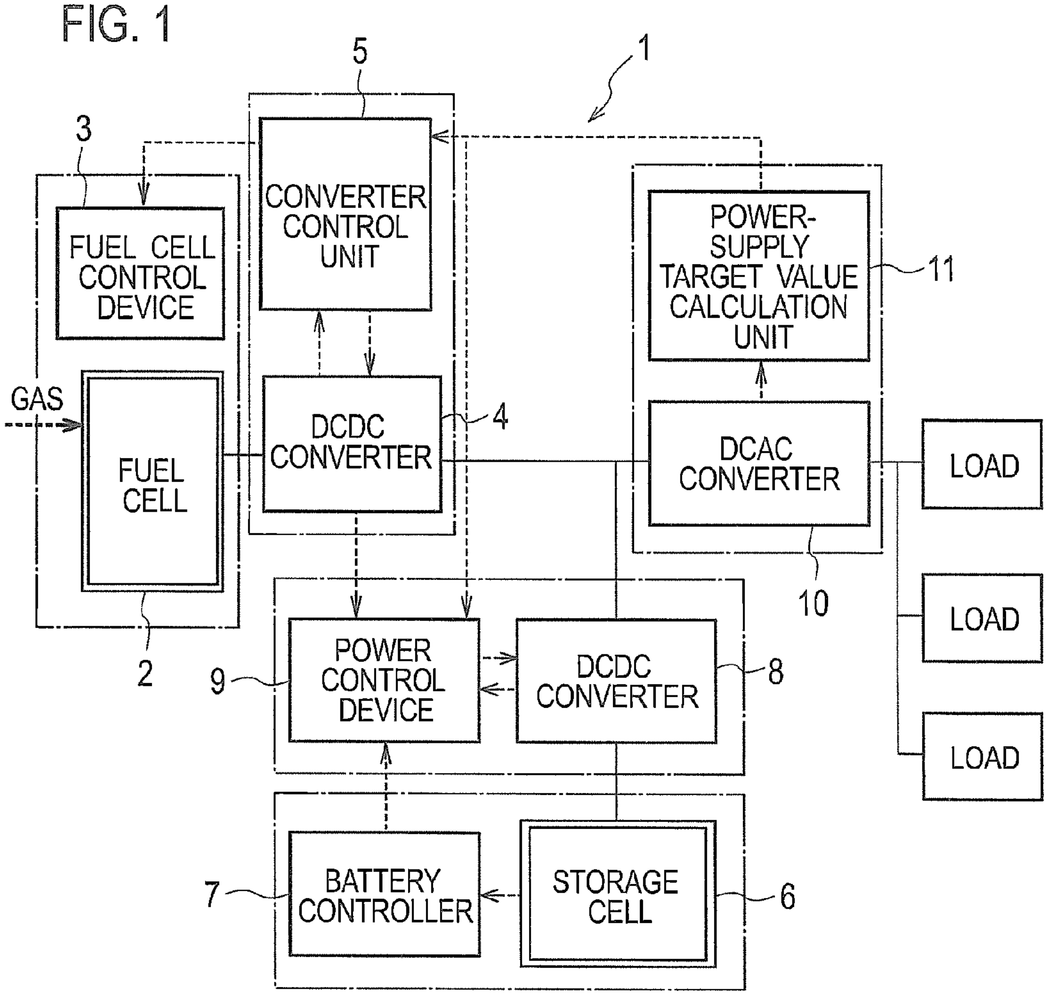
FIG. 1 is a block diagram illustrating a configuration of a power supply system according to one embodiment to which the present invention is applied.

FIG. 1 is a block diagram illustrating a configuration of a power supply system according to the embodiment. As illustrated in FIG. 1, a power supply system 1 according to the embodiment includes a fuel cell 2 to act as a power generating device to supply electric power, a fuel cell control device 3 to control power generation by the fuel cell 2, a DCDC converter 4 to convert the electric power generated by the fuel cell 2 into electric power required by a load, a converter control unit 5 to control output power from the DCDC converter 4, a storage cell 6 to compensate for the electric power if the electric power generated by the fuel cell 2 is excessive or insufficient for power consumption by the load, a battery controller 7 to control operation of the storage cell 6, a DCDC converter 8 to control charging and discharging for the storage cell 6, a power control device 9 to control output power from the DCDC converter 8, a DCAC converter 10 to convert DC power supplied by the fuel cell 2 and the storage cell 6 into AC power, and a power-supply target value calculation unit 11 to calculate and output a power-supply target value.

Here, the power supply system 1 according to the embodiment is a system in which the fuel cell 2 as the power generating device and the storage cell 4 are connected in parallel to supply electric power to the load, and compensates for insufficient power by output power from the storage cell 6 if the electric power generated by the fuel cell 2 is insufficient for power consumption by the load.

The fuel cell 2 is a power generating device in which supply of oxygen and a fuel (e.g. hydrogen gas or modified gas) is controlled and electric power is generated, based on a command from the fuel cell control device 3.

The fuel cell control device 3 controls the oxygen and the fuel (e.g. the hydrogen gas or the reformed gas) supplied to the fuel cell 2 so that the electric power generated by the fuel cell 2 reaches a power-supply target value inputted from the converter control unit 5.

The DCDC converter 4 converts the electric power generated by the fuel cell 2 so as to become equal to a power-supply target value, and outputs the electric power to DCAC converter 10.

The converter control unit 5 performs control so that the output power from the DCDC converter 4 reaches the power-supply target value, and calculates input power for the output power from the DCDC converter 4 to satisfy the power-supply target value, and outputs the calculated power as the power-supply target value to the fuel cell control device 3.

The storage cell 6 is a secondary cell capable of charging and discharging, such for example as a lithium ion cell, and the storage cell 6 is discharged to supply electric power to the load and is charged with excessive power.

The battery controller 7 detects a terminal voltage and an electric current of the storage cell 6 and calculates internal resistance, and detects a value of a temperature sensor provided in the storage cell 6 and outputs these values to the power control device 9.

The DCDC converter 8 converts the electric power of the storage cell 6 and outputs the converted power as the insufficient power when the electric power generated by the fuel cell 2 is insufficient for power consumption by the load. Also, the DCDC converter 8 inputs excessive power of the electric power generated by the fuel cell 2 to the storage cell 6 and charges the storage cell 6.

The power control device 9 calculates output power from the DCDC converter 8, based on the internal resistance and temperature of the storage cell 6 inputted from the battery controller 7, the power-supply target value inputted from the power-supply target value calculation unit 11, and the terminal voltage and current of the DCDC converter 4, and output a discharging or charging command to the DCDC converter 8 to control the DCDC converter 8. Specifically, the power control device 9 calculates an amount of power compensation by subtracting the output power of the DCDC converter 4 from the power-supply target value, and controls the DCDC converter 8 so that the output power of the DCDC converter 8 becomes equal to the amount of power compensation.

The DCAC converter 10 converts the DC power supplied by the fuel cell 2 and the storage cell 6 into AC power of a predetermined voltage (for example, 100 V) as an operating voltage of the load, and outputs the AC power to the load.

The power-supply target value calculation unit 11 calculates electric power required to maintain the voltage of the AC power to be output to the load at the predetermined voltage, as the power-supply target value, and outputs the power-supply target value to the converter control unit 5 and the power control device 9.

In the embodiment, the load is configured as an AC load to be operated by the AC power, and thus, the DCAC converter 10 which converts the DC power supplied by the fuel cell 2 and the storage cell 6 into the AC power and outputs the AC power is used; however, the present invention is not so limited. For example, if the load is configured as a DC load to be operated by DC power, a DCDC converter is used in place of the DCAC converter 10.

Figure 2:
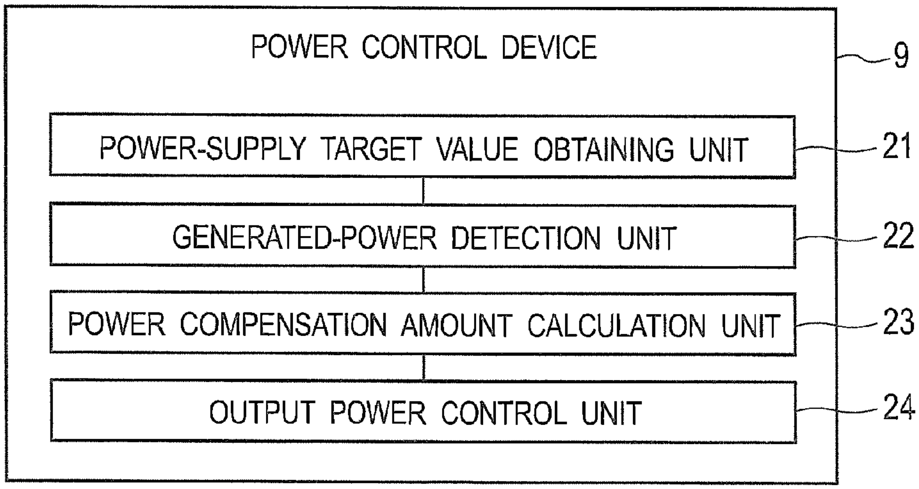
FIG. 2 is a block diagram illustrating a configuration of a power control device of the power supply system according to one embodiment to which the present invention is applied.

Next, a configuration of the power control device 9 according to the embodiment will be described with reference to FIG. 2. As illustrated in FIG. 2, the power control device 9 of the power supply system 1 according to the embodiment includes a power-supply target value obtaining unit 21 configured to obtain electric power being currently consumed by the load, as a power-supply target value, a generated-power detection unit 22 configured to detect a generated-power value of electric power generated by the fuel cell 2 with respect to the power-supply target value, a power compensation amount calculation unit 23 configured to calculate a deviation of the generated-power value from the power-supply target value and thereby determine the amount of power compensation to be supplied to the load from the storage cell 6, and an output power control unit 24 configured to determine current transient response characteristics of the storage cell 6, and perform control so that output power from the storage cell 6 becomes equal to the amount of power compensation, based on the current transient response characteristics.

Here, the power control device 9 is configured with a general-purpose electronic circuit including a microcomputer, a microprocessor and a CPU (central processing unit), and a peripheral device. A specific program is executed to allow the power control device 9 to operate as the power-supply target value obtaining unit 21, the generated-power detection unit 22, the power compensation amount calculation unit 23 and the output power control unit 24.

The power-supply target value obtaining unit 21 receives and obtains the power-supply target value calculated and outputted by the power-supply target value calculation unit 11.

The generated-power detection unit 22 calculates the output power from the DCDC converter 4, based on the voltage and current output from the DCDC converter 4, and detects the output power as the generated-power value of the fuel cell 2. Also, the generated-power detection unit 22 may prestore power generation characteristics of the fuel cell 2 with respect to the power-supply target value, and, in this case, the generated-power value is detected according to the power-supply target value.

The power compensation amount calculation unit 23 calculates the deviation by subtracting the generated-power value from the power-supply target value, and determines the deviation as the amount of power compensation by the storage cell 6.

The output power control unit 24 obtains the internal resistance of the storage cell 6 output by the battery controller 7, and calculates the current transient response characteristics of the storage cell 6, based on the internal resistance. Then, the DCDC converter 8 is controlled by changing control gain so that the output power from the storage cell 6 reaches the amount of power compensation, based on the current transient response characteristics. Also, the output power control unit 24 may prestore a change over time in the internal resistance of the storage cell 6, and, in this case, the change over time in the internal resistance since the time of initialization is added to the internal resistance at the time of the initialization according to a period of time elapsed since the initialization (or since the time at which the storage cell 6 is installed in the system) thereby to determine the internal resistance of the storage cell 6.

[Procedure for Power Control Operation of Storage Cell]

Next, description will be given with reference to a flowchart of FIG. 3 with regard to a procedure for power control operation by the power control device 9 of the power supply system 1 according to the embodiment.

Figure 3:
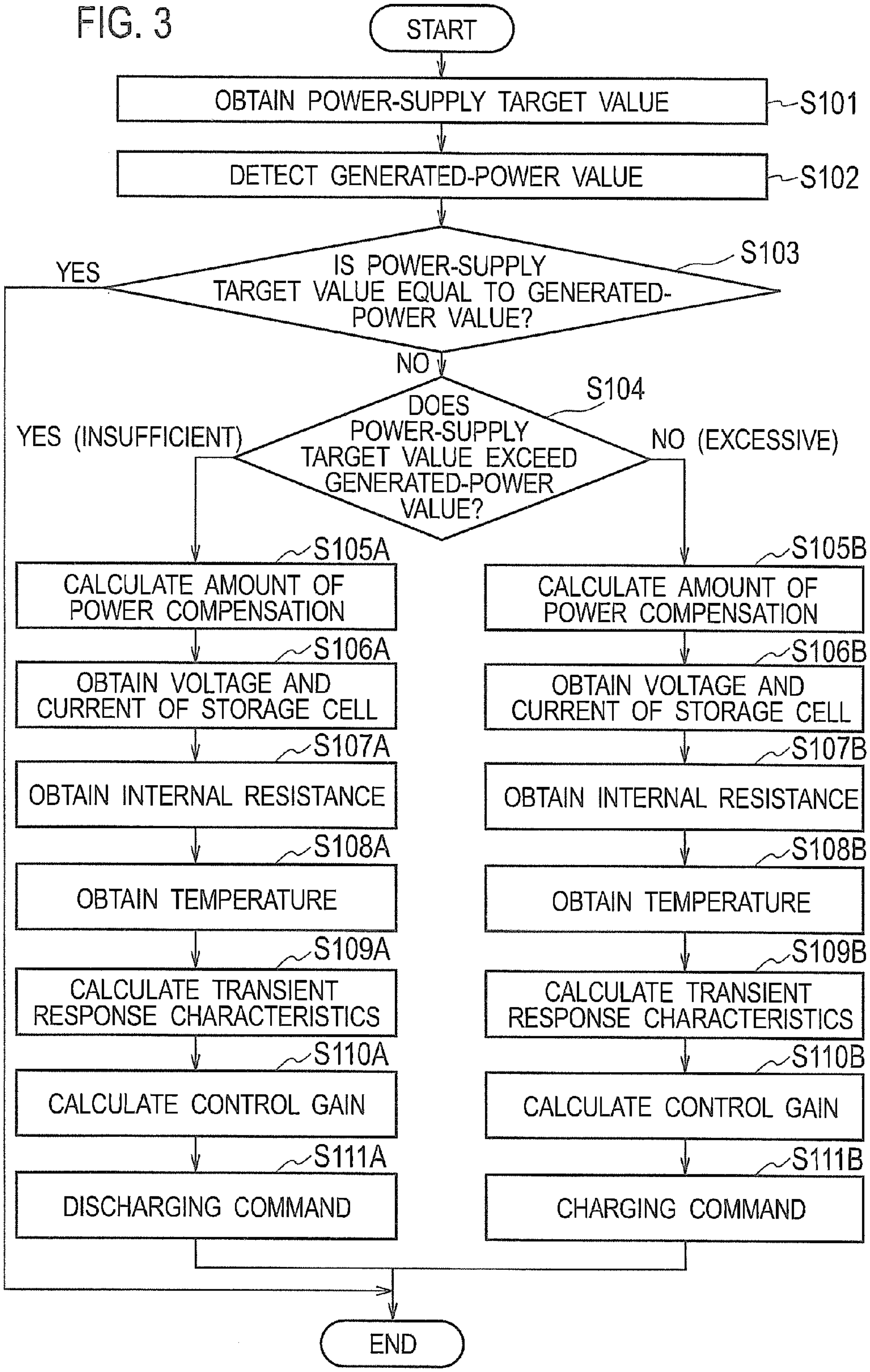
FIG. 3 is a flowchart illustrating a procedure for power control operation by the power control device of the power supply system according to one embodiment to which the present invention is applied.

As illustrated in FIG. 3, first, at step S101, the power-supply target value obtaining unit 21 obtains the power-supply target value output by the power-supply target value calculation unit 11, and recognizes electric power being currently consumed by the load.

Figure 4:
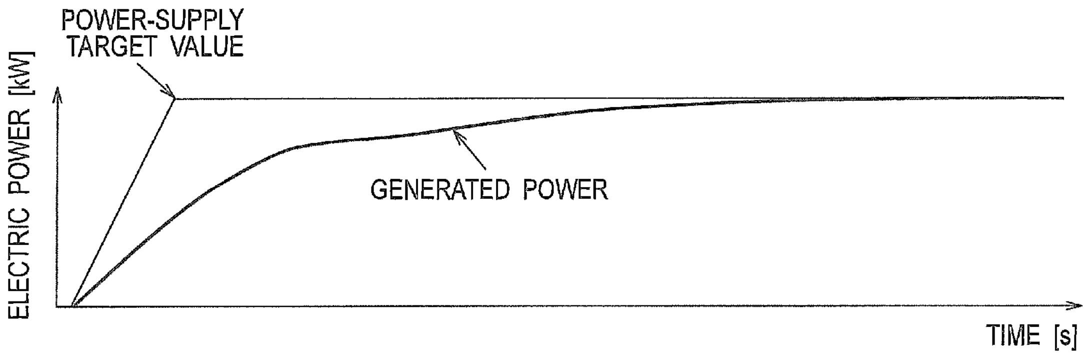
FIG. 4 is a graph illustrating power generation characteristics of a fuel cell with respect to a power-supply target value, stored by the power control device of the power supply system according to one embodiment to which the present invention is applied.

Then, at step S102, the generated-power detection unit 22 obtains a voltage value and a current value output by the DCDC converter 4, and detects the generated-power value of the fuel cell 2, based on the voltage value and the current value. Also, the generated-power detection unit 22 may prestore the power generation characteristics of the fuel cell 2 with respect to the power-supply target value, as illustrated in FIG. 4. In this case, the generated-power detection unit 22 determines the generated-power value according to the power-supply target value, and thus, feed forward control can be performed to thus enable achieving accuracy of processing and an improvement in processing speed.

Then, at step S103, the power compensation amount calculation unit 23 determines whether or not the power-supply target value is equal to the generated-power value. If the power-supply target value is equal to the generated-power value, power supply from the storage cell 6 is unnecessary, and thus, the power control operation according to the embodiment comes to an end.

Meanwhile, if at step S103 the power-supply target value is not equal to the generated-power value, the processing goes to step S104, and the power compensation amount calculation unit 23 determines whether or not the electric power generated by the fuel cell 2 is insufficient (or the power-supply target value exceeds the generated-power value). Then, if the electric power generated by the fuel cell 2 is insufficient (or the power-supply target value exceeds the generated-power value), the processing goes to step S105A, and the power compensation amount calculation unit 23 subtracts the generated-power value from the power-supply target value to calculate the deviation and determines the deviation as the amount of power compensation by the storage cell 6.

Then, at step S106A, the output power control unit 24 obtains the present voltage value and current value of the storage cell 6 output by the DCDC converter 8, and, at step S107A, obtains the internal resistance of the storage cell 6 from the battery controller 7.

Here, the internal resistance of the storage cell 6 may be always obtained in real time from the battery controller 7, or may be obtained only at the time of start of the system. If the internal resistance of the storage cell 6 is obtained only at the time of start of the system, at step S108A, the output power control unit 24 obtains the temperature of the storage cell 6 from the battery controller 7, and always corrects the value of the internal resistance according to the obtained temperature of the storage cell 6.

Figure 5:
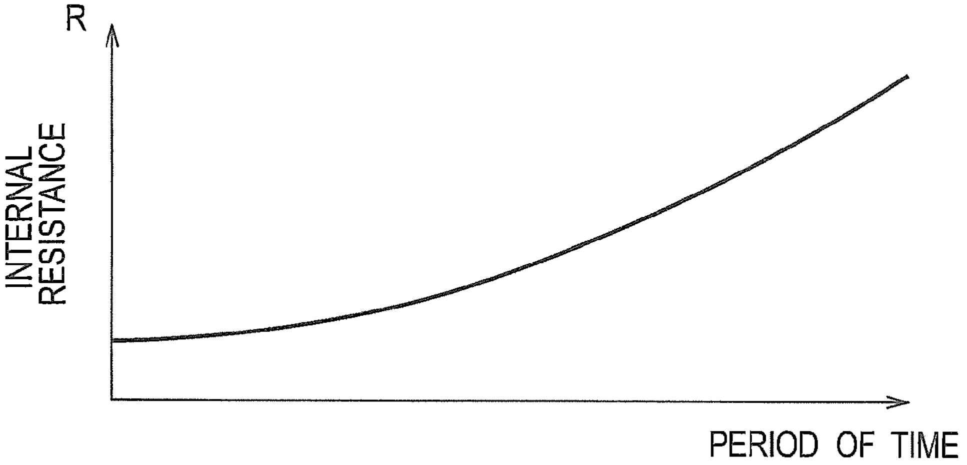
FIG. 5 is a graph illustrating a change over time in internal resistance of a storage cell, stored by the power control device of the power supply system according to one embodiment to which the present invention is applied.

Further, as illustrated in FIG. 5, the output power control unit 24 may prestore the change over time in the internal resistance of the storage cell 6 and determine the internal resistance of the storage cell 6 according to the period of time elapsed since the initialization. This enables easily obtaining the value of the internal resistance even without performing sequential calculation, and thus enables reducing the time required for the processing.

When the value of the internal resistance is thus obtained, at step S109A, the output power control unit 24 calculates the current transient response characteristics of the storage cell 6 based on the internal resistance. The transient response characteristics can be determined by solving a voltage equation of LCR circuit represented as Equation (1).

$$\frac{1}{C}\int_0^t i\,dt + L\frac{di}{dt} + iR = V_0 \tag{1}$$

Here, when the voltage equation represented as Equation (1) is solved, the transient response characteristics are represented as Equations (2) and (3):

$$i(t) = \frac{V_0}{\omega L}e^{-Rt/2L}\sin\omega t \tag{2}$$

$$\omega = \left[\frac{1}{LC} - \left(\frac{R}{2L}\right)^2\right]^{1/2} \tag{3}$$

where i(t) denotes an output current indicating the transient response characteristics of the storage cell 6; $V_0$ denotes a voltage value of a current response component of the terminal voltage of the storage cell 6 (or equivalently, a voltage value which varies according to the current, and a voltage value obtained by subtracting a no-load voltage from the terminal voltage); L denotes an inductance component inherent in the system; C denotes a capacitance component inherent in the system; and R denotes the internal resistance of the storage cell 6. Since L and C are constants, the transient response characteristics are determined by setting the internal resistance R.

Here, if the transient response characteristics are set using the internal resistance at the time of the initialization and are not corrected, an increase in the internal resistance due to the change over time causes a deterioration in the transient response characteristics and thus makes it impossible for the electric power of the storage cell 6 to accurately compensate for necessary electric power. However, in the embodiment, the current transient response characteristics are calculated based on the current internal resistance, and thus, even if the change over time causes a change in the transient response characteristics, the output power to the load can be accurately compensated.

When the current transient response characteristics are thus calculated, at step S110A, the output power control unit 24 calculates control gain capable of achieving the amount of power compensation, and, at step S111A, outputs a discharging command based on the control gain thereby to control the DCDC converter 8.

Thereby, if the electric power generated by the fuel cell 2 is insufficient for the power consumption by the load, the sufficient power is discharged by the storage cell 6, and the power control operation according to the embodiment comes to an end.

Meanwhile, if at step S104 the electric power generated by the fuel cell 2 is not insufficient (or the power-supply target value is less than the generated-power value), in other words, if the electric power generated by the fuel cell 2 is excessive, steps S105B to S110B perform the same processing as steps S105A to S110A. Then, at step S111B, a charging command is output to control the DCDC converter 8, and thereby, if the electric power generated by the fuel cell 2 is excessive for the power consumption by the load, the excessive power is charged into the storage cell 6, and the power control operation according to the embodiment comes to an end.

Advantageous Effects of Embodiment

Figure 6:
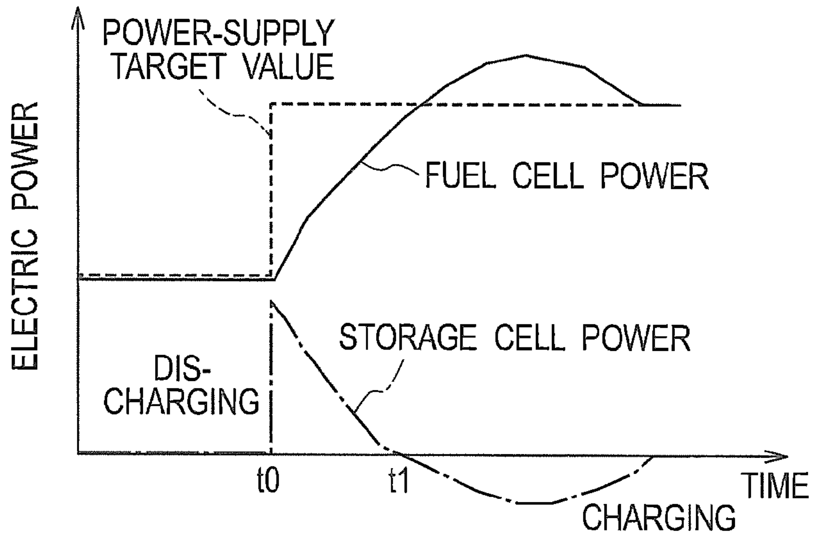
FIG. 6 is a graph of assistance in explaining advantageous effects of the power control operation by the power control device of the power supply system according to one embodiment to which the present invention is applied.

By performing the above-mentioned processing, the power control device 9 of the power supply system 1 according to the embodiment enables the discharging of the storage cell 6 to compensate for the insufficiency of the electric power generated by the fuel cell 2, when the power-supply target value changes sharply at time $t_0$ as illustrated in FIG. 6. Also, if after time $t_1$ the electric power generated by the fuel cell 2 exceeds the power-supply target value, the excessive power can be charged into the storage cell 6.

Further, the power control device 9 of the power supply system 1 according to the embodiment determines the current transient response characteristics of the storage cell 6 and performs control so that the output power from the storage cell 6 reaches the amount of power compensation based on the current transient response characteristics. Thereby, even if the transient response characteristics of the storage cell 6 change due to the change over time or the like, the output power to the load can be accurately compensated.

Figure 7:
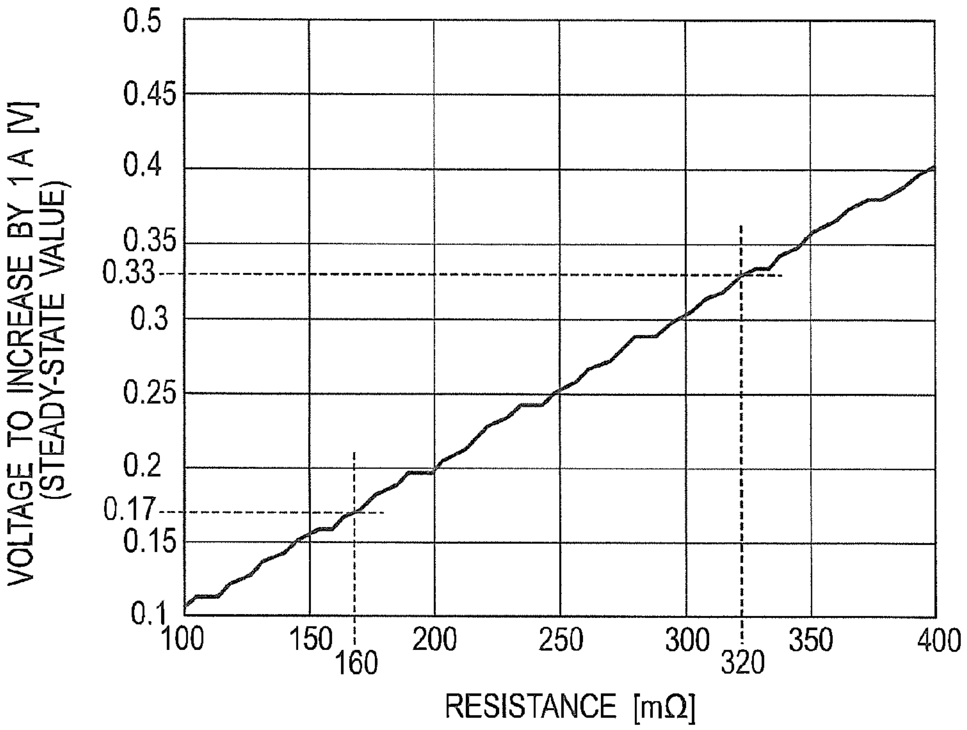
FIG. 7 is a graph illustrating a relationship between a voltage value to increase an output current by 1 A in the storage cell and the internal resistance.

For example, a relationship between the voltage value and the internal resistance to increase the output current by 1 A in the storage cell 6 is as illustrated in FIG. 7. Specifically, an increase in the value of the internal resistance from 160 mΩ to 320 mΩ causes an increase in a voltage required to increase the output current from the storage cell 6 by 1 A (or a voltage to be increased) from 0.17 V to 0.33 V. In other words, output power required for the storage cell 6 to increase the output current by 1 A increases from 0.17 W to 0.33 W.

Figure 8:
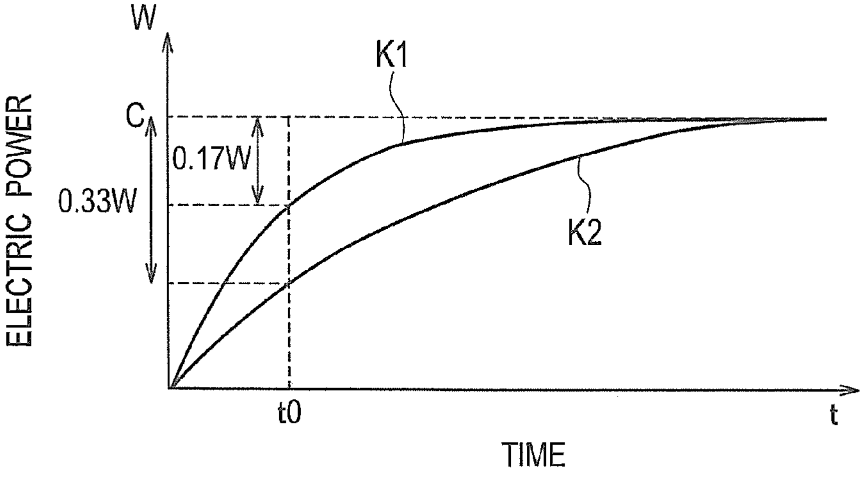
FIG. 8 is a graph of assistance in explaining advantageous effects of the power control operation by the power control device of the power supply system according to one embodiment to which the present invention is applied.

This will be described below in terms of the transient response characteristics. If the amount of power compensation is C [w] as illustrated in FIG. 8, when the internal resistance is 160 mΩ, the transient response characteristics of the storage cell 6 obtained by multiplying i(t) in Equation (2) by $V_0$ are K1. In this case, at the time $t_0$, an increase in the transient response characteristics to the amount of power compensation C [w] requires 0.17 W.

Meanwhile, when the storage cell 6 undergoes the change over time and hence the deterioration and thus the internal resistance reaches 320 mΩ, the transient response characteristics become K2, and, at the time $t_0$, an increase in the transient response characteristics to the amount of power compensation C [w] requires 0.33 W.

For example, when the transient response characteristics are set with the internal resistance remaining as it is at the time of the initialization, even though the transient response characteristics actually decrease from K1 to K2 due to the change over time, consideration is not given to this decrease, and therefore, the output power from the storage cell 6 cannot become accurately equal to the amount of power compensation.

On the other hand, even if when the internal resistance undergoes the change over time and hence the deterioration, the power control device 9 of the power supply system 1 according to the embodiment calculates the current transient response characteristics K2, and controls the output power from the storage cell 6 based on the current transient response characteristics K2. Therefore, even if the transient response characteristics of the storage cell 6 change due to the change over time or the like, the output power to the load can be accurately compensated.

In particular, according to the power control device 9 of the power supply system 1 according to the embodiment, the current transient response characteristics are calculated based on the internal resistance of the storage cell 6, and thus, the value of the internal resistance generally measured in the storage cell is utilized to enable easy calculation of the current transient response characteristics.

Also, the power control device 9 of the power supply system 1 according to the embodiment stores the change over time in the internal resistance of the storage cell 6, and determines the internal resistance of the storage cell 6 according to the period of time elapsed since the initialization. This enables easily obtaining the value of the internal resistance even without performing sequential calculation, and thus enables reducing the time required for the processing.

Further, the power control device 9 of the power supply system 1 according to the embodiment stores the power generation characteristics of the fuel cell 2 with respect to the power-supply target value, and determines the generated-power value according to the power-supply target value. Thereby, the stored power generation characteristics of the fuel cell 2 are utilized to perform the feed forward control, which in turn enables achieving the accuracy of the processing and the improvement in the processing speed.

Also, according to the power control device 9 of the power supply system 1 according to the embodiment, the control gain is changed according to the current transient response characteristics of the storage cell 6, and thus, the output power from the storage cell 6 can quickly become equal to the amount of power compensation.

Note that the above-mentioned embodiment is illustrative of the present invention. Of course, it is to be therefore understood that the present invention is not limited to the above-mentioned embodiment, and, even in a form other than this embodiment, various changes could be made hereto according to design or the like without departing from the technical concept of the present invention.

This application is based upon and claims the benefit of priority of the prior Japanese Patent Application No. 2012-180323, filed on Aug. 16, 2012, the entire contents of which are incorporated herein by reference.

INDUSTRIAL APPLICABILITY

According to the power supply system and the method for controlling the power supply system according to one aspect of the present invention, the current transient response characteristics of the storage cell are determined, and control is performed so that the output power from the storage cell reaches the amount of power compensation, based on the transient response characteristics, and thus, the output power to the load can be accurately compensated for. Therefore, the power supply system and the method for controlling the power supply system according to the aspect of the present invention have industrial applicability.

REFERENCE SIGNS LIST

1 power supply system
2 fuel cell
3 fuel cell control device
4 DCDC converter
5 converter control unit
6 storage cell
7 battery controller
8 DCDC converter

9 power control device
10 DCAC converter
11 power-supply target value calculation unit

The invention claimed is:

1. A power supply system including a storage cell connected in parallel with a power generating device for supplying electric power to a load, comprising:

a power-supply target value obtaining unit configured to obtain electric power being currently consumed by the load, as a power-supply target value;

a generated-power detection unit configured to detect a generated-power value of electric power generated by the power generating device with respect to the power-supply target value;

a power compensation amount calculation unit configured to calculate a deviation of the generated-power value from the power-supply target value and determine an amount of power compensation to be supplied to the load from the storage cell; and an output power control unit configured to determine current transient response characteristics of output power from the storage cell, and perform control so that the output power from the storage cell becomes equal to the amount of power compensation, based on the current transient response characteristics.

2. The power supply system according to claim 1, wherein the output power control unit calculates the current transient response characteristics of the output power from the storage cell, based on internal resistance of the storage cell.

3. The power supply system according to claim 2, wherein the output power control unit stores a change over time in the internal resistance of the storage cell, and determines the internal resistance of the storage cell according to a period of time elapsed since initialization.

4. The power supply system according to claim 1, wherein the generated-power detection unit stores power generation characteristics of the power generating device with respect to the power-supply target value, and detects the generated-power value according to the power-supply target value.

5. The power supply system according to claim 1, wherein the output power control unit changes control gain according to the current transient response characteristics of the output power from the storage cell.

6. A method for controlling a power supply system including a storage cell connected in parallel with a power generating device for supplying electric power to a load, comprising:

obtaining electric power being currently consumed by the load supplied with electric power from the power generating device and the storage cell, as a power-supply target value;

detecting a generated-power value of electric power generated by the power generating device with respect to the power-supply target value;

calculating a deviation of the generated-power value from the power-supply target value and determining an amount of power compensation to be supplied to the load from the storage cell; and determining current transient response characteristics of output power from the storage cell, and performing control so that the output power from the storage cell becomes equal to the amount of power compensation, based on the current transient response characteristics.

7. A power supply system including a storage cell connected in parallel with a power generating device for supplying electric power to a load, comprising:

a power-supply target value obtaining means for obtaining electric power being currently consumed by the load, as a power-supply target value;

a generated-power detecting means for detecting a generated-power value of electric power generated by the power generating device with respect to the power-supply target value;

a power compensation amount calculating means for calculating a deviation of the generated-power value from the power-supply target value and determining an amount of power compensation to be supplied to the load from the storage cell; and an output power controlling means for determining current transient response characteristics of output power from the storage cell, and performing control so that the output power from the storage cell becomes equal to the amount of power compensation, based on the current transient response characteristics.

* * * * *